United States Patent [19]
Nagami

[11] 4,334,295
[45] Jun. 8, 1982

[54] MEMORY DEVICE
[75] Inventor: Akira Nagami, Tokyo, Japan
[73] Assignee: Nippon Electric Co., Ltd., Tokyo, Japan
[21] Appl. No.: 145,537
[22] Filed: May 1, 1980
[30] Foreign Application Priority Data May 8, 1979 [JP] Japan .................................. 54-56160

[51] Int. Cl.³ .............................................. G11C 11/40
[52] U.S. Cl. ..................................... 365/222; 365/182
[58] Field of Search .......................................... 365/222

[56] References Cited
U.S. PATENT DOCUMENTS
3,737,879 6/1973 Greene et al. ....................... 365/222

*Primary Examiner*—Terrell W. Fears
*Attorney, Agent, or Firm*—Sughrue, Mion, Zinn, Macpeak & Seas

[57] ABSTRACT

A two-clock multi-address input dynamic random access memory provided with an internal refresh function for refreshing memory cells without receiving refresh address information from the outside is disclosed. The memory characteristically comprises a terminal for receiving a refresh control signal, refresh address means for designating a row address to be refreshed, means for producing confirmation signal when a reset precharge of a circuit relating to a refresh operation is completed, means for storing the refresh control signal when a row address strobe signal is in active level, and means responsive to the confirmation signal and the stored refresh signal for effecting the refresh operation.

19 Claims, 16 Drawing Figures

MEMORY DEVICE

BACKGROUND OF THE INVENTION

The present invention relates to a memory device composed of semiconductor elements and, more particularly, to a refreshing system for a dynamic type memory device using insulated-gate field-effect transisitors.

Dynamic type random access memories (hereinafter referred to as RAMs) are widely used in many fields. Recently, a RAM designated "MK 4816" and employing an improved refresing system was announced by MOSTEK co. of U.S.A. The latter device allows an internal refresh in which a refresh operation for memory cells is internally performed without receiving any refresh address information from the outside thereof by using a refresh control signal in addition to the conventional external refresh which requires refresh address information from the outside. This RAM achieves high-flexibility in control and its application.

RAMs employing multi-address input system in which row address information and column address information are incorporated respectively synchronism with row address strobe signal $\overline{RAS}$ and column address strobe singal $\overline{CAS}$ are substantially standard for dynamic RAMs with large capacity. A multi-address input type RAM is disclosed in U.S. Pat. No. 3,969,706 issued to R. J. Proebsting et al.

However, the multi-address input type RAM has some limitations between the strobe signals and the refresh operation, and such limitations have prevented the multi-address type RAM from incorporating the internal refresh of the "MK 4816" therein.

SUMMARY OF THE INVENTION

It is an object of the present invention to provide a dynamic RAM of a two-clock, multi-address input type, which has an internal refresh system.

It is another object of the present invention to provide a RAM provided with an internal refresh system used when a refresh control input is enabled during an active period of a row strobe signal.

A dynamic RAM according to the present invention comprises a first terminal for receiving a row strobe signal, a second terminal for receiving a column strobe signal, a set of terminals for receiving address input signals, a third terminal for receiving a refresh control signal, first means responsive to the row strobe signal for incorporating the address input signals as row address information, second means responsive to the column strobe signal for incorporating the address input signals as column address information, a memory cell array including a plurality of memory cells arranged in rows and columns, refresh means for operatively refreshing the memory cells on a row line designated by the row address information, refresh address means for designating a refresh address, third means for producing a first confirmation signal when the active operation of the refresh means ends, fourth means for producing a second confirmation signal when the reset precharge state ends, fifth means for latching the refresh control signal when the row strobe signal is present, a first control means responsive to the second confirmation signal and the latched refresh control signal for introducing refresh operation based on the refresh address means, and second control means responsive to the first confirmation signal for introducing the reset precharge state in the refresh means.

The present invention is summarized as follows: In a dynamic random access memory having as input signals a row strobe signal, a column strobe signal, address input, a write control signal, and a refresh control signal, having a function that, first by enabling the row strobe signal to incorporate the address input as row address information, a circuit involved automaticallly refreshes data stored in all the memory cells on a row line designated by the address input at this time, and then by enabling the column strobe signal, the circuit automatically transfers data between a selected memory cell on the column line designated by the address input at this time and a data input/output circuit, and having a refresh address counter in which when a refresh control signal is enabled, the internal refresh is automatically performed, and at the end of the active operation, a first confirmation signal is produced from an internal circuit; and at the end of a reset precharge operation, a second confirmation signal is produced from the internal circuit. When the refresh control signal is enabled during the active period of the row strobe signal, it is latched by the internal circuit. When the second confirmation signal becomes an active level signal, the internal circuit receives the latched signal to automatically to effect the internal refresh. When the internal refresh ends and the first confirmation signal becomes an active level signal, the circuit automatically enters the reset precharge period and subsequently the reset precharge state is continued.

DETAILED DESCRIPTION OF THE PREFERRED EMBODIMENTS

The explanation to be given proceed on the assumption that all transistors used are N channel metal-oxide-semiconductor transistors (hereinafter referred to as MOST) which are most typical in the insulated-gate field-effect transistors, and that a high level is logical "1" and a low level is a logical "0". It shall be understood that N-channel MOSTs can be substituted by P-channel MOSTs or another type insulated-gate field-effect transistors.

With reference to FIGS. 1 to 4, the operation of RAM "MK 4816" will be described.

The RAM employs as the input clock signals a chip enable signal $\overline{CE}$, an output enable signal $\overline{OE}$, a write control signal $\overline{WE}$, and refresh control signal $\overline{RFSH}$, and an input/output common terminal for data input and output. These signals $\overline{CE}$, $\overline{OE}$, $\overline{WE}$ and $\overline{RFSH}$ take their active state respectively when they are in low level.

In operation, when the chip enable signal $\overline{CE}$ as a basic clock shifts from high level to low level and the RAM enters an active period, an address input information at that time point is held (latched) and the contents of memory cells on a selected word (row) line are refreshed at the same time. Then data of a memory cell of the selected column and on the selected word line is transferred to a data bus and then is amplified by an output amplifier. The output enable signal $\overline{OE}$ controls whether the read out data is made to appear at the input/ouptut common terminal or not. When the signal $\overline{OE}$ is set to low level, the output data is obtained at the input/output common terminal (read cycle). While the data is written into a selected memory cell by shifting the signal $\overline{WE}$ to a low level to be enabled during the active period. At this time, input data to be written must be placed at the input/output common terminal. For this reason, the signal $\overline{OE}$ must be at its inactive level, i.e. at high level (write cycle). The reason for this is that if the signal $\overline{OE}$ is enabled i.e. low level, the read signal appears at the input/output common terminal, and it competes with the write input data. Therefore, in a read modify write cycle, after the signal $\overline{OE}$ is enabled i.e. low level in the RAM to read out the data, the signal $\overline{OE}$ is disabled, i.e. high level to be reset, and then the signal $\overline{WE}$ is turned to its enabled level, i.e. low level to write the data.

Consider now the refresh operation in question of the RAM referring to the drawings. The refresh is divided into the following operation modes.

MODE (1) (External refresh)

When the signal $\overline{RFSH}$ is kept at high level (inactive level) the activation of the signal $\overline{CE}$ refreshes memory cells on a word line designated by address input information provided from the outside, as in the case of the conventional dynamic RAM.

MODE (2)

Figure 1:
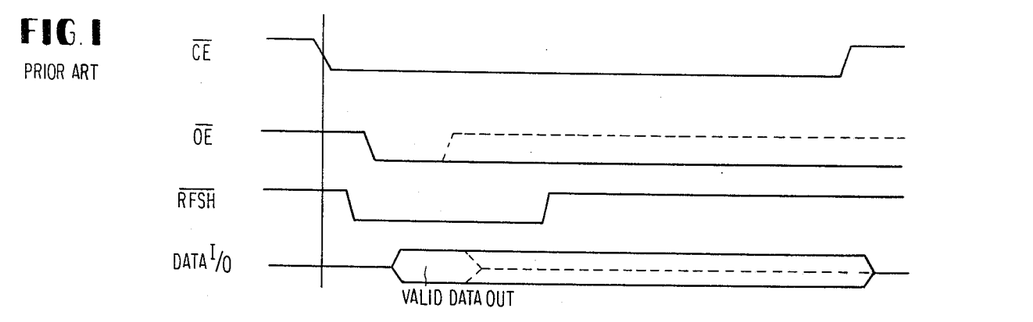
FIGS. 1 to 4 show sets of waveforms useful in explaning an internal refresh circuit system by applying a RFSH clock thereto during an active period in a conventional dynamic RAM with CE and OE as a basic clock which allows an internal refresh.

FIG. 1 shows an operation state of a case where before the read operation is completed in the read cycle, the signal $\overline{RFSH}$ is turned to its active level. Upon the active level of the signal OE, the read data appears at the input/output common terminal and after the completion of the read operation is confirmed, the whole memory circuit automatically shifts to a reset precharge period in the operation phase. The signal $\overline{RFSH}$ at an active level is latched. After the reset precharge is completed, the refresh cycle automatically starts. Then, the memory cells on the word line designated by a refresh address counter included in the RAM are refreshed. At the time of the refresh completion, whole memory circuit shifts again to the reset precharge period while the content of the refresh address counter is incremented.

Figure 2:
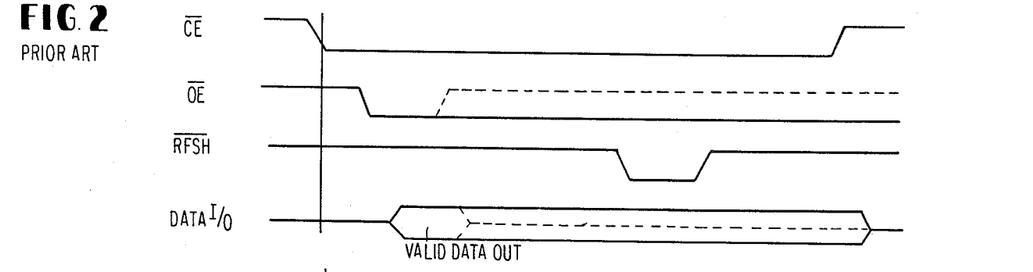

FIG. 2 shows another operation state in which the signal $\overline{RFSH}$ is turned to its active level after the readout operation is completed.

Figure 3:
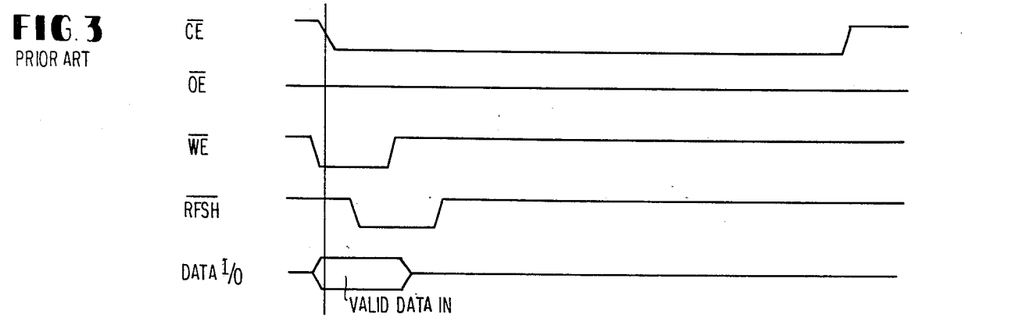

With an adequate time elapse after the signal $\overline{OE}$ is turned to its active level, the read data appears at the input/output common terminal while the whole memory circuit enters the reset precharge period and the operation has been completed substantially. At this time, if the signal $\overline{RFSH}$ is turned to its active level (low level), the memory circuit immediately starts the refresh cycle as in the operation shown in FIG. 1 and returns to the reset precharge state after the refresh cycle is completed. FIG. 3 illustrates an operation state where the signal $\overline{RFSH}$ is turned to active level in the early write cycle. In the early write cycle, the circuit automatically enters the reset precharge period after the write operation is completed. The refresh operation caused by the active level of the signal $\overline{RFSH}$ before the completion of the write operation and after an appropriate time since the completion thereof, is similar as those of FIGS. 1 and 2.

Figure 4:
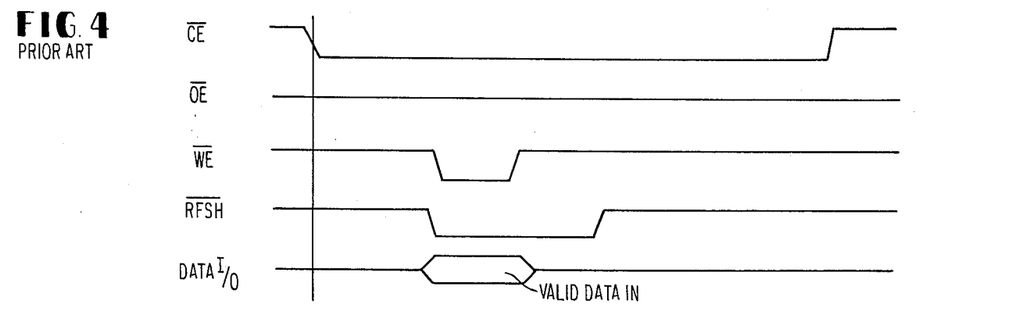

FIG. 4 shows a case that the signal $\overline{RFSH}$ is turned to its active level in the late write cycle. Also in this case, when the signal $\overline{WE}$ is at the active level and the write operation is completed, the memory circuit automatically enters the reset precharge period and the refresh operation is similarly performed as in the cases of FIGS. 1 and 2, if the active level of the signal $\overline{RFSH}$ occurs at a proper time position.

MODE (3)

When the signal $\overline{RFSH}$ is at the active level during the period that the signal $\overline{CE}$ is at the inactive level, the circuit enters the refresh operation immediately after the reset precharge is completed. Following the refresh operation, the circuit returns to the reset precharge state. Similarly, memory cells on the word line designated by the refresh address counter are refreshed and at the time point that the refresh of the memory cells are completed, the content of the refresh counter is incremented.

MODE (4) (AUTO-REFRESH)

When the signal $\overline{RFSH}$ is kept at low level (active level) for a long period (20 $\mu$s or more), so-called auto-refresh is performed at a relatively long period (15 $\mu$s). During this time period, the input signals other than the signal $\overline{RFSH}$ are all rejected by the memory circuit and the shift of the signal $\overline{RFSH}$ to a high level causes AUTO-REFRESH to end. This is effective particularly for a POWER DOWN operation (battery backup) and a SINGLE STEP operation of a microprocessor.

The refresh operation of the memory "MK4816" is as described above. When this refresh operation is applied to the multi-address input system which has two clock signals, that is a row strobe signal $\overline{RAS}$ and a column strobe signal $\overline{CAS}$, and address signals are inputted in a multiple manner into a RAM as previously described, the following problems arise. The two-clock, multi-address system is substantially a standard system in the MOS dynamic RAM with a large capacity, for example, 4K, 16K and 64K. When the signal $\overline{RAS}$ is at its active level (low level), the address information at that time point is latched as a row address information and the contents of all the memory cells on the word line specified by the row address information are refreshed. When the signal $\overline{CAS}$ is at its active level (low level), the address information at that time is latched as a column address information, and a selected memory cell of the column designated is coupled with a data input/output circuit. Under this condition, the read or the write operation is performed. Therefore, the signal $\overline{RAS}$ and $\overline{CAS}$ are not related to the signals $\overline{CE}$ and $\overline{OE}$ respectively by one to one correspondence. The external refresh of MODE (1) in this system is exactly the same as the conventional one. MODE (3) corresponds to a case that the signal $\overline{RFSH}$ is at the active level during the reset period of the inactive level of the signal $\overline{RAS}$. This operation is relatively easily performed since it is realized by providing the refresh cycle in the reset precharge state. The refresh mode due to MODE (4) is a refresh mode that the signal $\overline{RFSH}$ is kept at a low level for a long period and all the input signals other than the signal $\overline{RFSH}$ are inhibited from inputting into the RAM whereby the refresh of the RAM is automatically performed under control of the internal circuit alone. Accordingly, this refresh mode is also possible in the two-clock, multi-address input system in question. The problem resides in the application of the refresh mode due to "MODE (2)" into the two-clock, multi-address input system. As previously stated, in the MK4816, upon the active level of the signal $\overline{OE}$ or $\overline{WE}$, the data is read out or after the completion of the write operation is confirmed, the circuit is automatically shifted to the reset precharge phase, and following the completion thereof the internal refresh operation is introduced. MODE (2) refresh operation corresponds to a case that the signal $\overline{RFSH}$ is turned to its active level during the active level period of the signal $\overline{RAS}$ in the read or write cycle. In the refresh operation, after the completion of the enabled access operation, the reset precharge is automatically performed and then the refresh cycle must be performed. In the case of the MK4816, the output data appears as a result of the active level of the signal $\overline{OE}$ in the read cycle. In the write cycle, since a single terminal (the input/output common terminal) is used for the data input and output, it is impossible to turn the signal $\overline{OE}$ at the active level during the write operation. For this reason, the completion of the read operation may be confirmed referring to the time point that the signal $\overline{OE}$ is turned to the active level. The completion of the write operation may be confirmed referring to the time point that the signal $\overline{WE}$ is made the active level. In the two-clock, multi-address input system, both the signals $\overline{RAS}$ and $\overline{CAS}$ must be made the active level for the read cycle and the write cycle, so that the distinction thereof as in the case of the MK4816 is impossible. Particularly, the distinction between the read cycle and the late write cycle can not be made until the signal $\overline{WE}$ is made the active level. Accordingly, it is impossible to apply the refresh mode of the MK4816 system to the internal refresh for the signal $\overline{RFSH}$ enabled during the active period of the $\overline{RAS}$.

Figure 5:
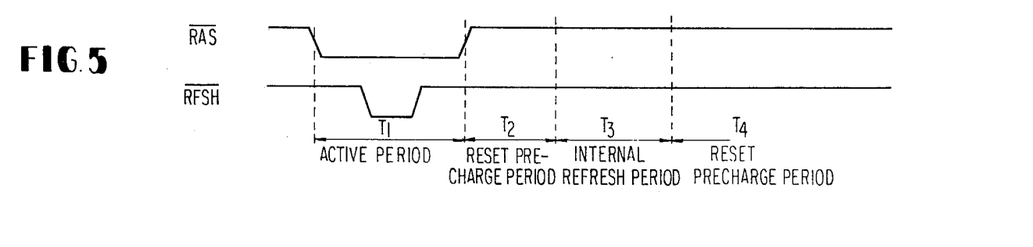
FIG. 5 is waveforms useful in explaining the internal refresh system according to the present invention which allows the internal refresh by applying a $\overline{RFSH}$ clock thereto during an active period of a $\overline{RAS}$ in a dynamic RAM of the two-clock, multi-address input system with $\overline{RAS}$ and $\overline{CAS}$ as basic clocks.

The principle of the internal refresh system according to the invention will be described referring to FIG. 5. The signal $\overline{RFSH}$ may be enabled at any time position in the active period of the signal $\overline{RAS}$ and is latched in an internal circuit of a RAM. The signal $\overline{RFSH}$ remains latched during an active period T1 of the signal $\overline{RAS}$ and until the signal $\overline{RAS}$ is turned to the inactive level to be reset. Then the whole RAM circuit enters a reset precharge period T2 and a confirmation signal representing a confirmation of the end of the reset precharge operation is produced. Upon the generation of the confirmation signal, the circuit responds to the signal $\overline{RFSH}$ latched to automatically enter an internal refresh period T3, and to refresh memory cells on a word line corresponding to a row address specified by a refresh address counter. When the internal refresh operation is complete, the circuit automatically enters reset precharge period T4 where the content of the refresh address counter is incremented and the circuit prepares for the next internal refresh operation. Accordingly, the circuit waits for the next activation (active level) of the $\overline{RFSH}$ or $\overline{RAS}$ while it is in the reset precharge state. In the internal refresh by enabling the signal $\overline{RFSH}$ during the reset precharge (inactive level) period of the signal $\overline{RAS}$, immediately following the activation of the signal $\overline{RFSH}$, the internal refresh is performed immediately following confirmation of the end of the reset precharge operation, and the circuit automatically enters the reset precharge period after the internal refresh is completed.

Figure 6:
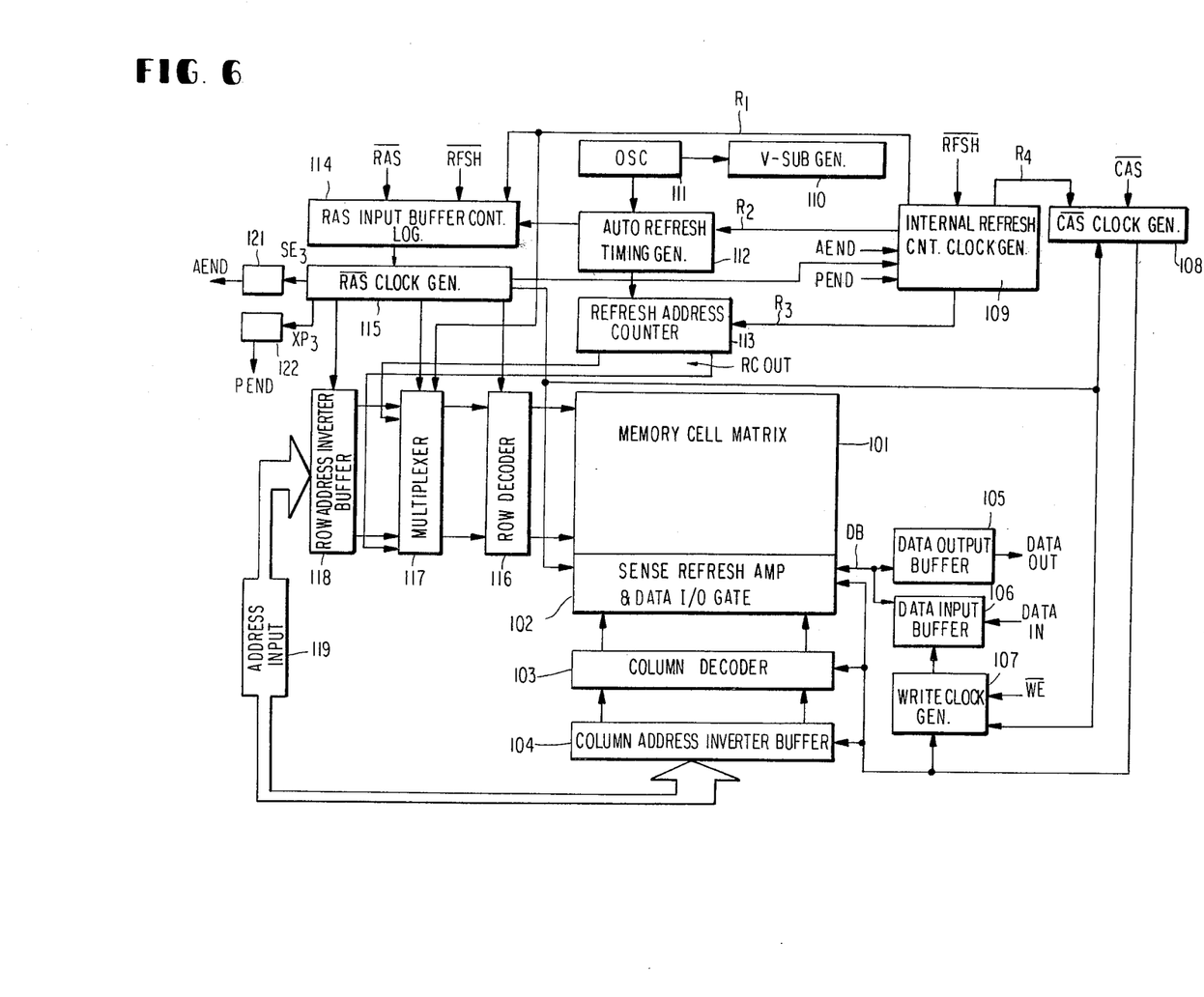
FIG. 6 shows a block diagram of a RAM circuit of the two-clock, multi-address system using the internal refresh system according to the present invention.

A circuit structure of the RAM due to the two-clock, multi-address system (multi-address type RAM), which employs the internal refresh system according to the invention, is illustrated in FIG. 6. The way of inputting the signal $\overline{RFSH}$ classifies the operation of the multi-address type RAM into the following four modes:

(1) Cycle operation when the signal $\overline{RFSH}$ is in inactive state
(2) Activation of the signal $\overline{RFSH}$ during the active period of the signal $\overline{RAS}$
(3) Activation of the signal $\overline{RFSH}$ during the reset period of the $\overline{RAS}$
(4) Activation of the $\overline{RFSH}$ for a long time period The operation mode of (1) is a normal circuit operation. In the (1) mode, upon the activation of the signal $\overline{RAS}$, a $\overline{RAS}$ series clock generating circuit 115 operates to produce a series of internal control signals. In response to one of the internal control signals, the address input 119 at that time point is latched by a row address inverter buffer 118 as a row address, and the output of the row address inverter buffer 118 is determined. Then, a row decoder 116 performs the selecting operation of a word (a row) line in a memory cell matrix 101. Finally, memory cells in the memory matrix 101 on the word line specified by the row address input are refreshed (external refresh).

When the column address strobe signal $\overline{CAS}$ is enabled later than the activation of the signal $\overline{RAS}$, a $\overline{CAS}$ series clock generating circuit 108 produces a series of control signals. The address input 119 at that time point is latched as a column address by a column address inverter buffer 104 in response to one of the $\overline{CAS}$ series control signals, and the output of a column address inverter buffer 104 is determined. Then a column decoder 103 performs the selecting operation of a memory cell belonging to the selected word line in the memory matrix 101, and a selected memory cell on the column selected is coupled with a data input/output bus DB through a sense amplifier, and a data input/output (I/O) gate portion 102.

In the read cycle, read data from the selected memory cell appears at an output terminal DATA OUT, through a data output buffer 105. In the write cycle, following the start of the $\overline{CAS}$ series clock generating circuit 108, a write clock generating circuit 107 starts to operate in response to the activation of the write enable signal $\overline{WE}$. The output of a data input buffer 106 is enabled in accordance with a level of a signal at a data input terminal DATA IN at this time, so that data is written into a selected memory cell.

The operation mode of (2) is an internal refresh mode enabling the present invention to be effective. During the active period of the signal $\overline{RAS}$, if the signal $\overline{RFSH}$ is enabled, the signal $\overline{RFSH}$ is immediately latched in an internal refresh control clock generating circuit 109. During the active period of the signal $\overline{RAS}$, terminated after the signal $\overline{RFSH}$ is enabled, the active operation of the cycle is continued while the internal refresh operation is not performed. That is, the latch operation of the signal RFSH is independently performed in the refresh control clock generating circuit 109. When the $\overline{RAS}$ is turned to the inactive level to be reset, $\overline{RAS}$ series clock generating circuit 115 is reset and the $\overline{CAS}$ series clock generating circuit 108 and the write clock generating circuit 107 are in turn reset. As a result, the whole circuit shifts its operation to the reset precharge period. Upon the completion of the reset precharge operation, precharge confirmation signal PEND representing the confirmation of the completion is produced by a precharge detection circuit 122. At this time, based on the latched signal $\overline{RFSH}$, the internal refresh control clock generating circuit 109 enables a cycle signal for the internal refresh and applies it to a $\overline{RAS}$ input buffer control logic unit 114. In response to the cycle signal (paths R1-R4), a $\overline{RAS}$ series clock generating circuit 115 operates while at the same time the $\overline{CAS}$ series clock generating circuit 108 and the write clock generating circuit 107 are inhibited from operating by a signal path R4 from the internal refresh control clock generating circuit 109. The output signal RCOUT from the refresh address counter 113 is transferred to the row decoder 116 through a multiplexer 117 thereby to refresh memory cells on the word line designated. When the refreshing operation is completed, a refresh confirmation signal AEND is produced by a refresh detection circuit 121, so that the cycle signal of the internal refresh is reset and the content of the refresh address counter 113 is incremented for the next interval refresh. In this connection, since the precharge and the refresh operations are controlled by a series of timing signals including precharge timing signals and enable timing signals produced by the RAS series clock generator circuit 115, the precharge detection circuit 122 and the refresh detection circuit 121 operate based on the timing signals produced by the circuit 115. Through the $\overline{RAS}$ input buffer control logic unit 114 under the control of the circuit 112, the $\overline{RAS}$ series clock generator 115 enters the reset precharge period. Subsequently, this state is kept up.

When the signal $\overline{RFSH}$ is enabled during the reset period of the $\overline{RAS}$ in the operation mode (3), the internal refresh control clock generating circuit 109 immediately operates and, in response to the precharge confirmation signal of the end of the reset precharge operation, the cycle signal of the internal refresh is enabled. As in the case of the mode (2), the $\overline{RAS}$ series clock generating circuit 115 operates through the $\overline{RAS}$ input buffer control logic unit 114 to refresh memory cells on the word line designated by the refresh address counter 113. After the operation of the refresh is completed, the cycle signal (R1-R4) of the internal refresh is reset and the refresh address counter 113 is incremented, so that the whole system enters the reset precharge period. The operation mode (4) corresponds to a case that the signal $\overline{RFSH}$ is enabled for a predetermined time period or more and, in this mode, "AUTO REFRESH" is performed. In this case, an output with a fixed period of an oscillator circuit 111 is necessary which is commonly used for a substrate bias voltage generating circuit 110, normally. When the signal $\overline{RFSH}$ enabled and a predetermined time is elapses, the cycle signals (R1-R4) for the AUTO REFRESH are enabled to operate the $\overline{RAS}$ series clock generating circuit 115, through the $\overline{RAS}$ input buffer control logic unit 114. As a result, memory cells on the word line specified by the refresh address counter 113 are refreshed. During a period that the signal $\overline{RFSH}$ is enabled, the $\overline{RAS}$ input buffer control logic unit 114 rejects the inputting thereto but accepts only the cycle signal (R1) of the AUTO REFRESH which occurs periodically. Accordingly, the cycle signal (R1) of AUTO REFRESH superposes the operation of the whole circuit, so that the increment of the refresh address counter 113 and the reset precharge operation are kept up after its completion so long as the signal $\overline{RFSH}$ is kept low level.

Figure 7:
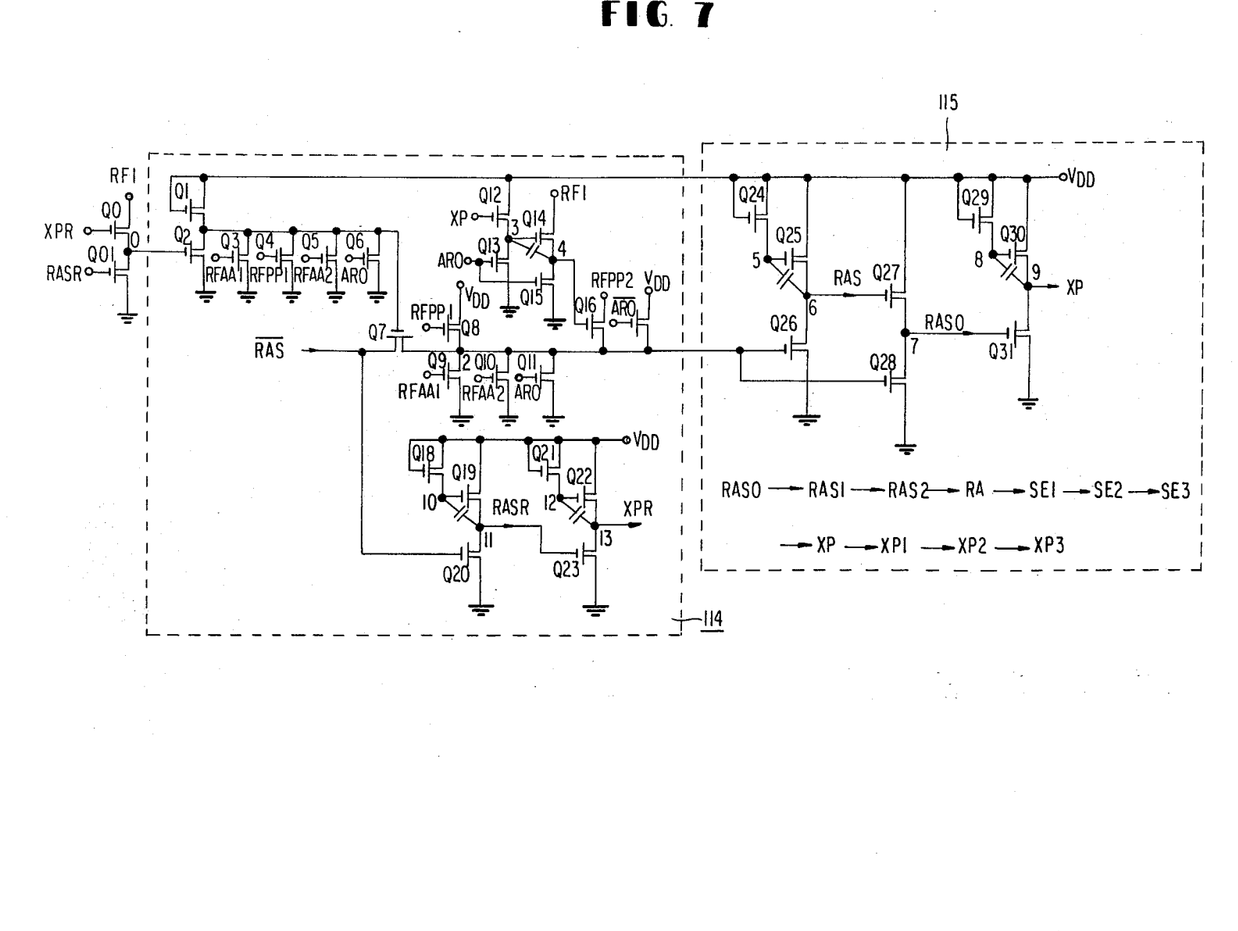
FIGS. 7 to 15 show circuit diagrams of the embodiments of the RAM of the two-clock, multi-address system using the system according to the present invention.
Figure 8:
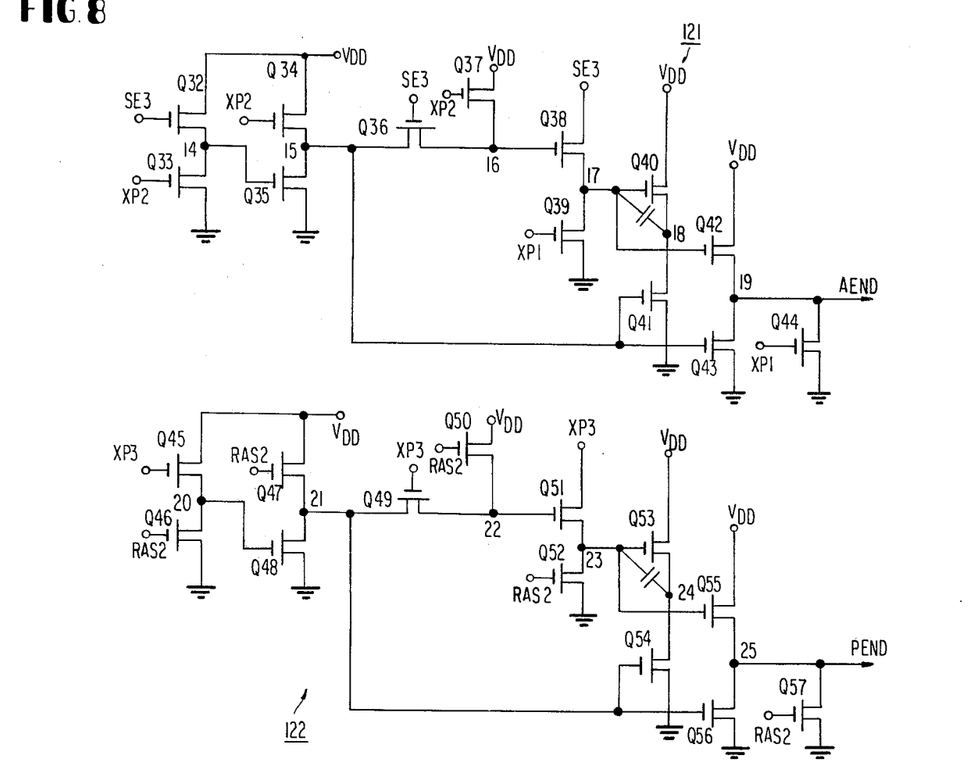
Figure 16:
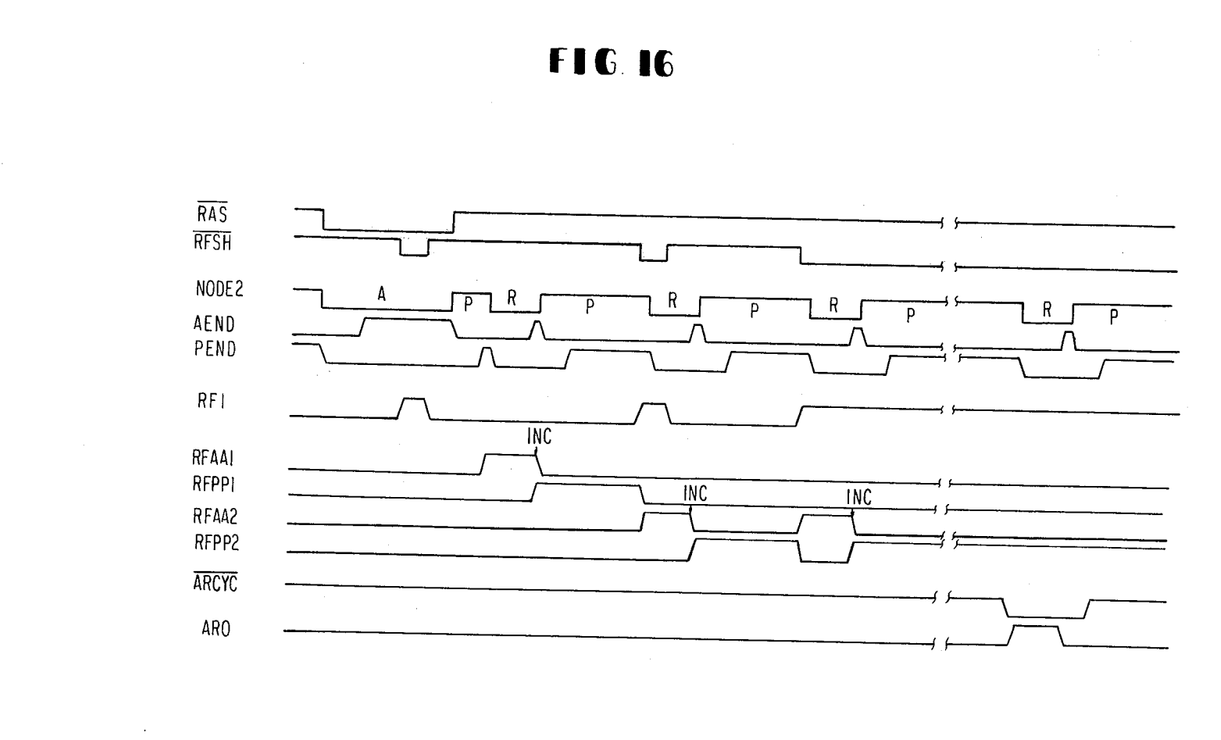
FIG. 16 shows a timing diagrams for explaining the operations mainly relating to the present invention in the circuit shown in FIGS. 7 to 15.

The explanation of the multi-address type RAM will be further described in detail referring to FIGS. 7 to 15 illustrating detailed circuit diagrams of the RAM and FIG. 16 illustrating a timing diagram useful in explaining the operation of the embodiment. The explanation will proceed with relation to the operation modes (1) to (4), for ease of explanation. In the cycle operation, where the signal $\overline{RFSH}$ of the (1) is inactive, the timing signals to control the internal refresh such as RF1, RFAA1, RFFPP1, RFAA2, RFPP2, AR0 and $\overline{AR0}$ which are produced from the circuit 109 in FIG. 6 are all in low level in FIG. 7. A node 1 of the $\overline{RAS}$ input buffer control logic unit 114 becomes low in level ($V_{DD}$-threshold voltage), so that the level of $\overline{RAS}$ appears at node 2 as it is. When the signal $\overline{RAS}$ is enabled, the $\overline{RAS}$ series clock generating circuit 115 operates with an interrelation as shown in FIG. 7. The enable timing signals such as RAS, RAS0, RAS1, ... SE3 successively rise thereby to refresh the memory cell on the selected word line. Following the signal $\overline{RAS}$, the signal $\overline{CAS}$ is enabled, so that the selected memory cell is coupled to the data input/output circuit (106 or 105). As a result, the contents of the memory cell is read out or input data is written into the memory cell in accordance with the signal $\overline{WE}$. For effecting the internal refresh to be given, logically necessary are signals for confirming the end of the active operation (refresh) and the end of the reset precharge operation. To this end, the refresh detection circuit 121 produces the active operation (read and early write) end confirmation signal AEND in response to the final enable timing SE3 produced by the circuit 115. The precharge detection circuit 122 produces the reset precharge operation and confirmation signal PEND in response to the final precharge timing XP3. Detailed structures of the refresh detection circuit 121 and the precharge detection circuit 122 are shown in FIG. 8.

Figure 9:
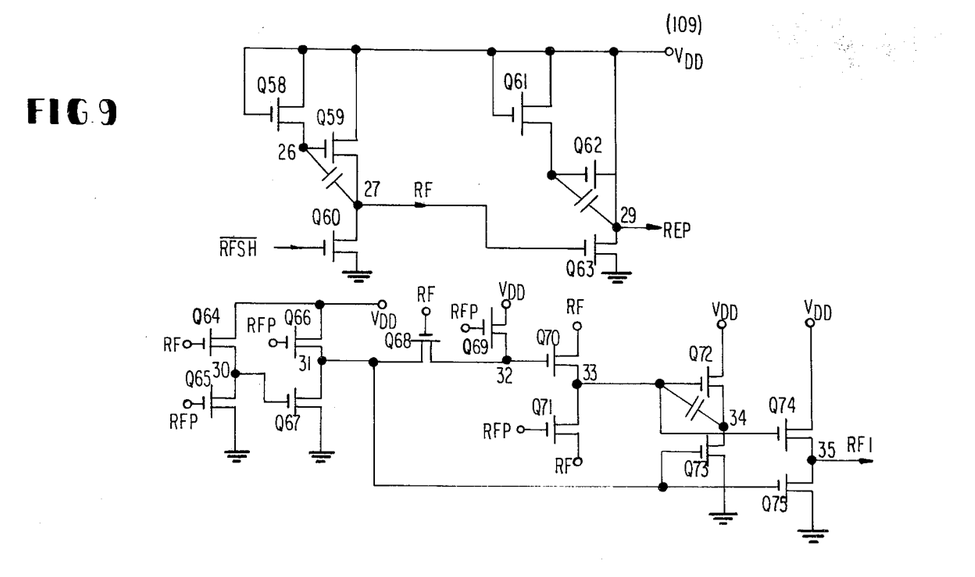
Figure 10:
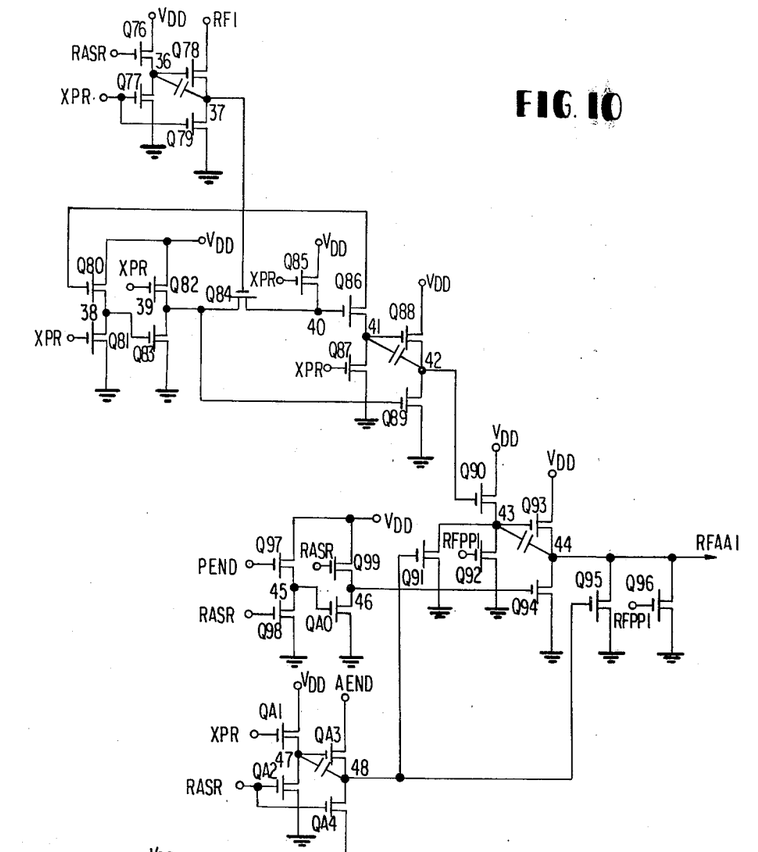
Figure 11:
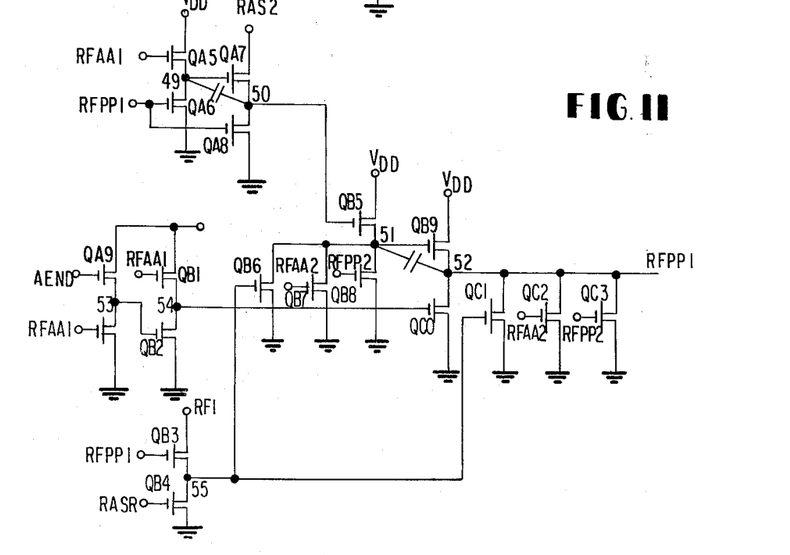

Next, with reference to FIGS. 9 to 12, detailed structure of the internal refresh control clock generator circuit 109 will be described. In FIG. 9, when the signal $\overline{RFSH}$ is enabled, the signal RF firstly rises to the $V_{DD}$ (power voltage) level and then the signal RFP shifts to a low level and further the signal RF1 rises to the level $V_{DD}$. Those three timing signals exhibit level change in synchronism with the signal $\overline{RFSH}$. The waveforms illustrating the operation of the mode (2) performed when the internal refresh system according to the present invention are illustrated in FIG. 16. In the figure, Ⓐ designates an active period, Ⓟ a reset precharge period, Ⓡ an internal refresh period, and INC a time point that the refresh address counter is incremented. When the signal $\overline{RFSH}$ is enabled during the active period of $\overline{RAS}$, in the circuit shown in FIG. 10 the signal RF1 rises and the signal at node 37 rises. As shown in FIG. 7, signals RASR and XPR are synchronized with the signal $\overline{RAS}$ and are an active timing signal and a reset precharge timing signal, which are isolated from the part of the internal refresh control clock generating circuit (109) in FIG. 9. A signal at the node 37 rises only during the active period of the $\overline{RAS}$.

Figure 14:
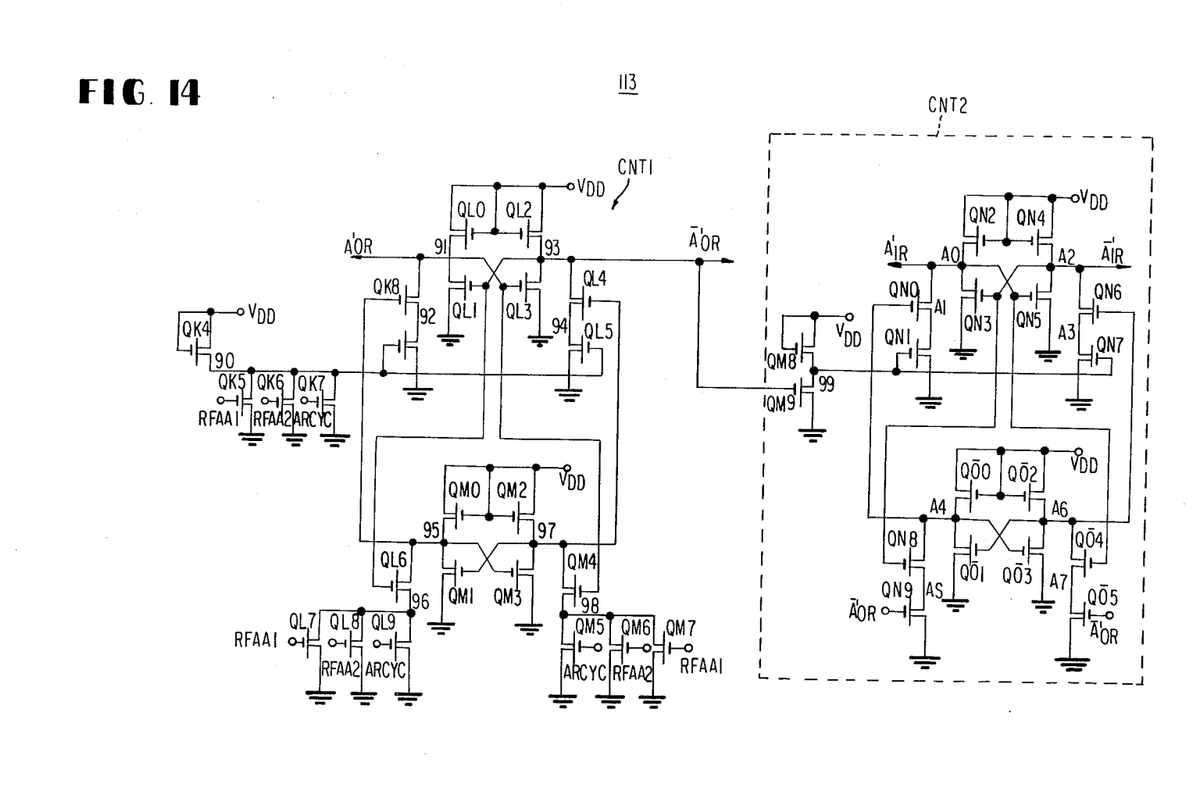
Figure 15:
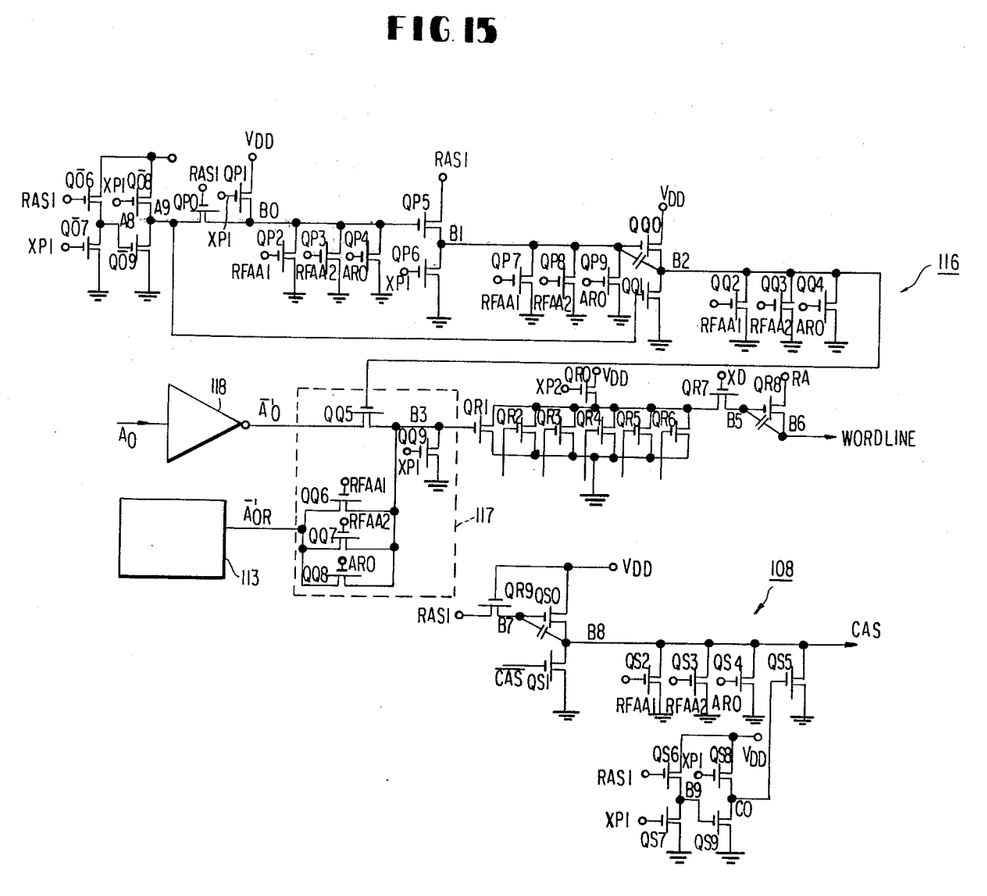

A buffer circuit comprised of MOSTs $Q_{80}$ to $Q_{89}$ responds to the rise of the signal at the node 37, so that a signal at a node 42 rises to reach $V_{DD}$ level. At the time that the level of the node 42 rises, a signal at node 40 shifts to ground potential and the MOST $Q_{86}$ become nonconductive. And the node 42 is isolated from the signal RF1 and it is kept at the $V_{DD}$ level during the remaining active period of $\overline{RAS}$. A MOST $Q_{90}$ charges a node 43 to a ($V_{DD}$-threshold voltage) level. At this time, a node 46 also has the same level by a signal RASR. With a MOST $Q_{94}$ having a much larger current ability than a MOST $Q_{93}$, the signal RFAA1 is kept at low level. When the signal $\overline{RAS}$ is reset and enters the reset precharge period, the signal RAS and RASO in FIG. 7 shift to low level, so that the reset precharge operation starts. At the same time, the signal RASR shifts to low level and the signal XPR rises to the $V_{DD}$ level. The node 42 shifts to ground potential by the XPR while the node 43 is still kept at the ($V_{DD}$-threshold voltage) dynamically. Upon the completion of the reset precharge operation, the confirmation signal PEND is issued and the node 46 shifts to low level, so that the MOST $Q_{94}$ becomes nonconductive the signal RFAA1 rises to reach the $V_{DD}$ level. In FIG. 7, the MOST $Q_3$ conducts to shift the node 1 to low level so that the MOST $Q_7$ is nonconductive to isolate the signal $\overline{RAS}$ from the node 2. The MOST $Q_9$ also conducts and the node 2 shifts to ground potential, and further the signal RAS rises so that the $\overline{RAS}$ series clock generating circuit 115 enters the active period. The row decoder 116 is constructed as shown in FIG. 15 and provided with the multiplexer 117 so that either the output of the address inverter buffer 118 or the output of the refresh address counter 113 serves as a decoder input. Upon rise of the signal RFAA1, a node B2 becomes ground potential, the MOST $QQ_5$ becomes nonconductive so that the address inverter output and the decoder input are isolated from one another, while at the same time the output from the refresh address counter 113 is transferred through the MOST $QQ_6$ to the decoder input. As a result, the memory cells on the selected word line are refreshed. As shown in the same figure, the rise of the signal RFAA1 restricts an output CAS of the first stage of the CAS series clock generator circuit 108 to be low level, so that the $\overline{CAS}$ series clock generating circuit 108 can not operate and only the refresh operation at the row side is performed. When the refresh operation completes and the signal AEND rises in level, the signal at the node 48 in FIG. 10 follows the rise of the signal AEND, so that MOSTs $Q_{91}$ and $Q_{95}$ conduct to shifts the signal RFAA1 to ground potential. In response to a change of the RFAA1 to the low level, the refresh address counter 113, a first and a second stages CNT1 and CNT2 which are shown in FIG. 14, is caused to increment while at the same time it causes the signal RFPP1 of the circuit 109 shown in FIG. 11 to rise in level. In FIG. 7, the node 2, while being isolated from the $\overline{RAS}$, is raised to the ($V_{DD}$-threshold voltage) level by the MOST $Q_8$, the signal RAS shifts to low level, and the $\overline{RAS}$ series clock generating circuit 115 enters the reset precharge period. Upon the completion of the reset precharge operation, the circuit operation for enabling the signal $\overline{RFSH}$ during the active period of $\overline{RAS}$ is completed.

Figure 12:
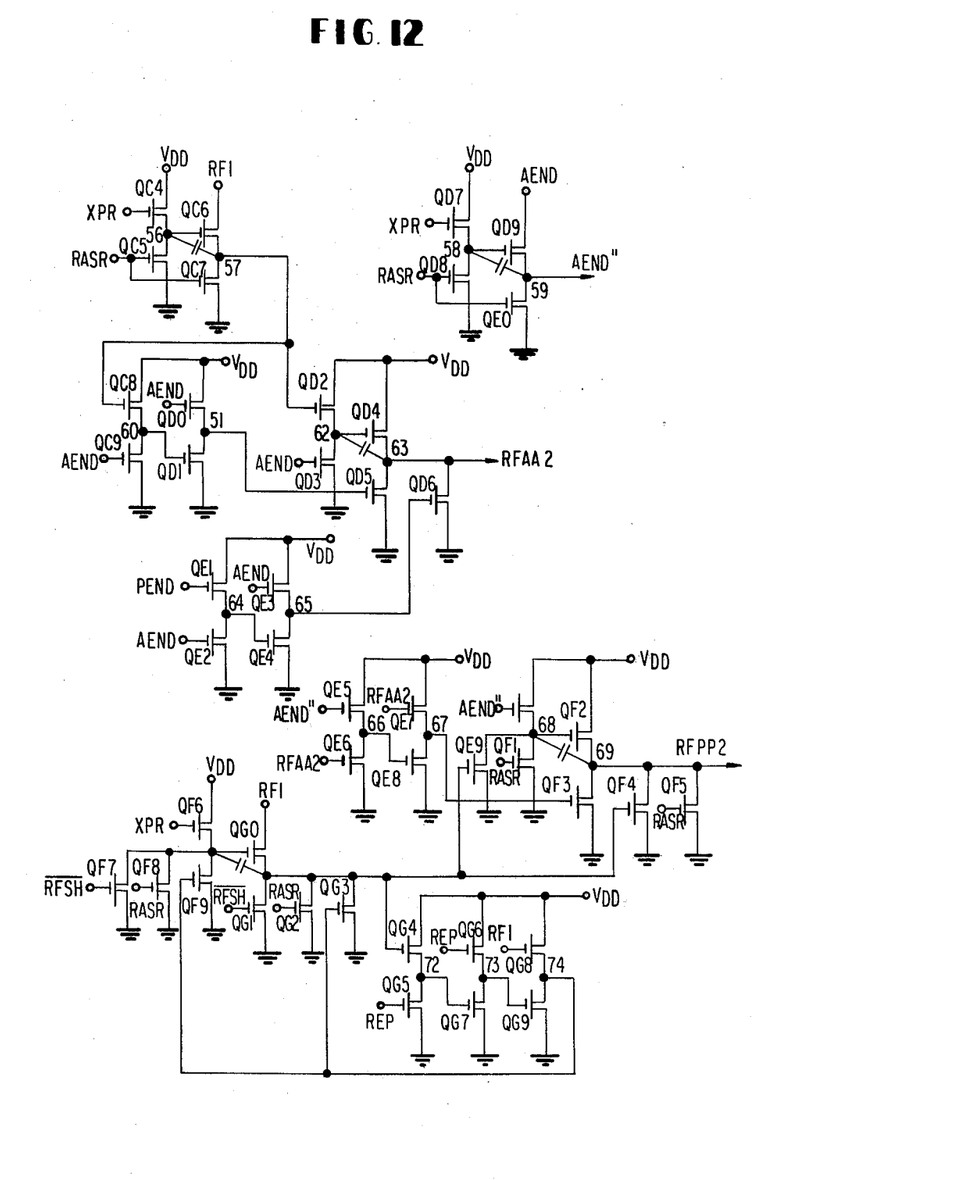

When the $\overline{RFSH}$ is enabled during the reset period of the RAS in the mode (3), a signal at node 57 in FIG. 12 rises in level following the signal RF1, the signal level at a node 62 is charged to the ($V_{DD}$-threshold voltage), and the signal levels at the node 61 and 65 shift to low level. Then, the signal RFAA2 rises to the $V_{DD}$ level. Following the rise of the signal level at the node 57, the signal level at the node 61 shifts to ground potential. The signal level at the node 65 goes to ground potential at the time that the reset precharge is completed. With the rise of the signal RFAA2, the signal level at the node 2 in FIG. 7 shifts to low level, the signal RAS rises and the $\overline{RAS}$ series clock generating circuit 115 enters the active period. As in the case of the signal RFAA1, cells on the word line designated by the refresh address counter 113 are refreshed, and the operation is completed to rise the signal AEND. As a result, the signal RFAA2 shifts to ground potential, as shown in FIG. 12. Immediately after this, the signal RFPP2 rises. Upon the level change of the signal RFAA2 to low level, the content of the refresh address counter 113 is incremented while the signal level at the node 1 in FIG. 7 rises to the ($V_{DD}$-threshold voltage) level. Then, the signal $\overline{RAS}$ of high level appears at the node 2 through the MOST $Q_7$. Accordingly, the $\overline{RAS}$ series clock generating circuit 115 enters the reset precharge period and the operation ends. At this time, the circuit operation in the case of the mode (3) terminates.

Figure 13:
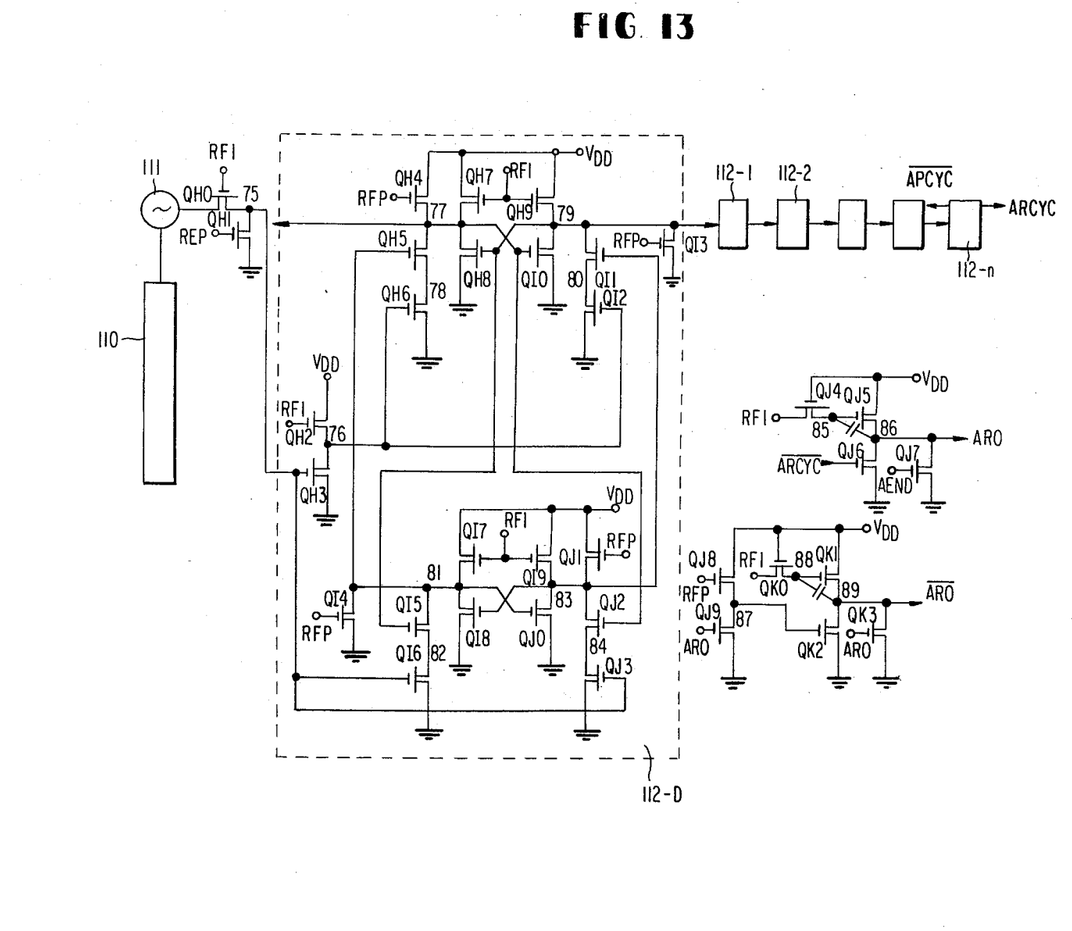

The AUTO REFRESH which is introduced when the signal $\overline{RFSH}$ of the mode (4) is enabled for a given period of time or longer, is controlled by the circuit shown in FIG. 13. As shown in FIG. 13, the auto refresh timing generator circuit 112 is made of a counter including a plurality stages of master-slave flip-flop circuits 112-0–112-n. During the period of time that the signal RFSH is in high level, the counter is set to the initial condition and it shifts to low level to be enabled. At this time, the output signal from the oscillator circuit 111 is transferred to MOST QHO. The output $\overline{ARCYC}$ from the final stage 112-n of the counter determines the timing of the AUTO REFRESH and at the initial stage the $\overline{RFSH}$ shifts to low level and after a given time the ARCRC shifts to low level. At this time, the signal ARO rise and the signal level at the node 2 in FIG. 7 shifts to ground potential. As a result, the $\overline{RAS}$ series clock generating circuit enters the active period. The refresh operation in this case is quite similar to that of the case of the signal RFAA1 for RFAA2. After the refresh operation completes and the signal AEND rises, the ARO in FIG. 13 shifts to low level, and the signal level at the node 2 rises. Accordingly, the $\overline{RAS}$ series clock generating circuit 115 enters the reset precharge period. Subsequently, it is left in the reset precharge state until the signal $\overline{ARCYC}$ changes from high level to low level. So long as the signal $\overline{RFSH}$ is kept at low level, the RF1 is in high level and the signal level at node 1 in FIG. 7 is in low level. The signal $\overline{RAS}$ is isolated from the node 2. The operation of the $\overline{RAS}$ series clock generating circuit 115 is controlled by the signal ARO and the signal $\overline{ARO}$. Since the signal $\overline{ARCYC}$ is a counter responds for the output signal from the oscillator circuit 111, it takes a waveshape with a given cycle during the period the signal RFSH is in low level. The internal refresh automatically continues.

As described above, in the internal refresh circuit according to the invention, when receiving a refresh control signal $\overline{RFSH}$ enabled during the active period of the row strobe signal $\overline{RAS}$, the memory circuit latches it by an internal circuit. Then row strobe signal $\overline{RAS}$ is reset, and the circuit enters the reset precharge period. The latched state of $\overline{RFSH}$ is kept until a signal for confirming the end of the reset precharge operation is produced. When the confirmation signal rises, the circuit receives the latch signal to automatically enter the internal refresh period. As a result, memory cells on the word line correponding to the row address designated by the refresh address counter. When the internal refresh operation ends, a confirmation signal is produced and the circuit automatically enters the reset precharge period. Subsequently, the circuit keeps the reset precharge state. The internal refresh is applicable for the refresh control signal which is enabled during the active period of the row strobe signal $\overline{RAS}$ in the dynamic RAM of the two-clock, multiaddress system. A flexible use of the RAM is attained in the practical use.

I claim:

1. A memory device comprising a first terminal for receiving a row strobe signal, a second terminal for receiving a column strobe signal, a set of address terminals, a third terminal for receiving a refresh control signal, first means responsive to said row strobe signal for storing address signals applied to said address terminals as row address information, second means responsive to said column strobe signal for storing address signals applied to said address terminals as column address information, a memory cell matrix including memory cells arranged in rows and columns, refresh means responsive to said row strobe signal for refreshing the memory cells on the row designated by said row address information , said refresh means taking a reset precharge state in response to absence of said row strobe signal, refresh address means for designating an address of said row to be refreshed, third means for producing a confirmation signal when said reset precharge state ends, fourth means for storing said refresh control signal when said row strobe signal is present, and a control means responsive to said confirmation signal and the lacthed refresh control signal for introducing a refresh operation based on said refresh address means.

2. The memory device according to claim 1, further comprising means responsive to said refresh control signal for controlling said refresh address means.

3. The memory device according to claim 2, further comprising a data bus line and selection means responsive to said column strobe signal for coupling a memory cell on the column designated by said column address information with said data bus line.

4. The memory device according to claim 3, further comprising means for producing a completion signal when refresh operation is completed, and means responsive to said completion signal for introducing said reset precharge state into at least said refresh means.

5. In a dynamic random access memory having as input signals a row strobe signal, a column strobe signal, a multiaddress input signal, and a refesh control signal, having a function that first by enabling the row strobe signal, data stored in all the memory cells on a row line designated by an address input at this time are automatically refreshed and by enabling the column strobe signal, data between a selected memory cell on the column line designated by the address input at this time and a data input/output circuit is automatically transferred and having a refresh address means in which when said refresh control signal is enabled, the said refresh is internally performed, the improvement comprises first means for producing a first confirmation signal at the end of active operation and a second means producing a second confirmation signal at the end of a reset precharge operation, third means for storing said refresh control signal when it becomes active during the active time of said row strobe signal, fourth means responsive to said second confirmation signal and the stored refresh control signal for effecting the internal refresh operation, and fifth means responsive to said first confirmation signal for effecting reset precharge operation.

6. A dynamic random access memory as claimed in claim 5 wherein said fourth means comprises a MOST circuit means responsive to said second confirmation signal and said stored refresh control signal for generating a refresh initiate signal, refresh enable signal generating means responsive to said refresh initiate signal for generating enabling signals in accordance with a sequence required to refresh the memory cells in a designated row line, and isolation means responsive to said refresh initiate signal for isolating said new strobe signal from said memory during the internal refresh operation.

7. A dynamic random access memory as claimed in claim 6 wherein said memory is of the type having a row decoder adapted to receive external address information and access a row line of said memory, the improvement further comprising, a refresh address counter for storing and incrementing row addresses, a multiplexer means receiving said external address information and said row addresses from said refresh address counter for applying one of said addresses selectively to said row decoder, said multiplexer including circuit means responsive to said refresh initiate signal for blocking said external address information from being applied to said decoder and for applying said row address information from said refresh address counter to said decoder.

8. A dynamic random access memory as claimed in claim 7 further comprising means responsive to the termination of said refresh initiate signal for incrementing said refresh address counter.

9. A memory device comprising a first terminal for receiving a row strobe signal from a memory device control means provided externally to said memory device, a second terminal for receiving a column strobe signal from said memory device control means, a set of address terminals for receiving address signals from said memory device control means, a third terminal for receiving a refresh command signal designating internal refresh operation from said memory device control means, first means responsive to said row strobe signal for storing address signals present on said set of address terminals as row address information, second means responsive to said set column strobe signal for storing address signals present on said address terminals as column address information, a memory cell matrix including memory cells arranged in rows and columns, row drive means for operatively driving row memory cells, refresh address means for internally designating an address of the row to be refreshed irrespective of said row address information, first control means responsive to said row address strobe signal for enabling said row drive means for driving a row address designated by said row address information irrespective of said refresh command signal, means for detecting completion of the drive operation of said row drive means, means for refreshing the contents of the driven memory cells for a predetermined time after the completion of said drive operation of said row drive means in response to said completion detecting means, third means for producing a confirmation signal when said predetermined time for said refresh operation ends, second control means for operatively enabling said row drive means for a row address designated by said refresh address means when said refresh command signal is present and said row address strobe signal is absent, fourth means for storing said refresh command signal when said row strobe signal is present, and third control means enabling said row drive means for a row address designated by said refresh address means in response to said stored refresh command when said confirmation signal is present and said refresh command signal is stored.

10. In a dynamic random access memory receiving as input signals supplied from memory control means provided external to said memory, a row strobe signal, multi-address input signals, and a refresh control signal, having a function that in response to the row strobe signal, a row line designated by an address input during an active time of said row strobe signal is made active and in response to the column strobe signal, data stored in a selected memory cell on said row line and on a column line designated by the address input at this time is read out, and having internal refresh means responsive to said refresh control signal for internally effecting a refresh operation to refresh memory cells on a row irrespectively of said address information supplied from said external source, the improvement comprising first means producing a confirmation signal after the completion of said active state of said row line, second means for storing said refresh control signal when it becomes active during said active state of said row line, third means responsive to said confirmation signal when said refresh control signal is stored in said second means for enabling said internal refresh means thereby to effect an internal refresh operation.

11. A memory device receiving memory device control signals provided from a source external to said memory device, said memory device comprising a plurality of memory cells arranged in rows and columns, a first terminal for receiving a row address strobe signal, a second terminal for receiving a column address strobe signal, a set of address terminals, a row address inverter circuit, a column address inverter circuit, means responsive to said row address strobe signal for supplying said row address inverter circuit with address signals present on said set of address terminals during an active time of said row address strobe signal, means responsive to said column address strobe signal for supplying said column address inverter circuit with address signals present on said set of address terminals during an active time of said column address strobe signal, a plurality of sense amplifiers connected to said columns of said memory cell, a refresh control terminal receiving a refresh control signal from said external source, a row address decoder circuit for operatively driving one of said rows of said memory cells, a data input/output circuit, a column decoder circuit for operatively providing an electrical path between a selected column and said data input/output circuit, a row clock generator for generating a first control signal for designating a completion of an active operation of said row decoder circuit, an internal refresh control circuit receiving said refresh control signal from said external source, said first control signal and said row address strobe signal for operatively generating an internal refresh start signal, a refresh address counter receiving an input from said internal refresh control circuit, a multiplex circuit for selectively transferring a selected one of the output of said row address inverter circuit and the output of said refresh address counter to said row decoder circuit in response to said internal refresh start signal, said internal refresh control circuit storing said refresh control signal when said row strobe signal is present and generating said internal refresh start signal in response to said first control signal when said refresh control signal is stored, and a first control circuit for controlling said refresh address counter in response to said internal refresh start signal, said multiplex circuit transferring the output of said refresh address counter to said row decoder when said internal refresh start signal is present while transferring the output of said row address inverter circuit to said row decoder when said internal refresh start signal is absent, whereby said refresh control signal when received during an active operation of said memory device causes an internal refresh operation after said active operation.

12. The memory device according to claim 9, further comprising a second control circuit responsive to said row address strobe signal for enabling said row clock generator.

13. The memory device according to claim 9, further comprising means for detecting the presence of said refresh control signal over a predetermined period for generating an auto refresh signal, and means responsive to said auto refresh signal for controlling said internal refresh control circuit so as to continuously generate said internal refresh start signal.

14. The memory device according to claim 9, further comprising means responsive to said refresh command signal for controlling said refresh address means.

15. The memory device according to claim 14, further comprising a data bus line and selection means responsive to said column strobe signal for coupling a memory cell on the column designated by said column address information with said data bus line.

16. The memory device according to claim 15, further comprising means for producing a completion signal when refresh operation is completed, and means responsive to said completion signal for setting said predetermined time for said row drive means.

17. A dynamic random access memory as claimed in claim 10 wherein said third means comprises a MOST circuit means responsive to said confirmation signal and said stored refresh control signal for generating a refresh initiate signal, refresh enable signal generating means responsive to said refresh initiate signal for generating enabling signals in accordance with a sequence required to refresh the memory cells in a designated row line, and isolation means responsive to said refresh initiate signal for isolating said new strobe signal from said memory during the initial refresh operation.

18. A dynamic access memory as claimed in claim 17 wherein said memory is of the type having a row decoder adapted to receive external address information and access a row line of said memory, the improvement further comprising a refresh address counter for storing and incrementing row addresses, a multiplexer means receiving said external address information and said word addresses from said refresh address counter for applying one of said addresses selectively to said row decoder, said multiplexer including circuit means responsive to said refresh initiate signal for blocking said external address information from being applied to said decoder and for applying said row address information from said refresh address counter to said decoder.

19. A dynamic random access memory as claimed in claim 18 further comprising means responsive to the termination of said refresh initiate signal for incrementing said refresh address counter.

* * * * *

UNITED STATES PATENT AND TRADEMARK OFFICE
CERTIFICATE OF CORRECTION

PATENT NO. : 4,334,295
DATED : June 8, 1982
INVENTOR(S) : Nagami

It is certified that error appears in the above—identified patent and that said Letters Patent is hereby corrected as shown below:

Column 1, line 13, change "co." to --Co.--;

line 26, change "singal" to --signal--.

Column 2, line 9, change "automaticallly" to --automatically--;

line 27, change "to effect" to --effect--;

line 34, change "explaning" to --explaining--;

line 52, before "timing" delete --a--.

Column 3, line 50, change "OE" to --$\overline{OE}$--.

Column 4, line 6, begin a new paragraph beginning with "FIG. 3";

line 33, change "refresh counter" to --refresh address counter.

UNITED STATES PATENT AND TRADEMARK OFFICE
CERTIFICATE OF CORRECTION

PATENT NO. : 4,334,295

DATED : June 8, 1982

INVENTOR(S) : Nagami

It is certified that error appears in the above—identified patent and that said Letters Patent is hereby corrected as shown below:

Column 7, line 61, before "enabled" insert --is--;

line 62, change "time is elapses," to --time elapses,--.

Column 8, line 18, change "RFFPP1," to --RFPP1,--.

Column 10, line 32, change "RFSH" to --$\overline{\text{RFSH}}$--;

line 57, change "responds" to --response--.

Signed and Sealed this

Sixteenth Day of November 1982

[SEAL]

Attest:

GERALD J. MOSSINGHOFF

Attesting Officer  Commissioner of Patents and Trademarks